US007583510B2

(12) United States Patent
Wang

(10) Patent No.: US 7,583,510 B2
(45) Date of Patent: Sep. 1, 2009

(54) TRANSCEIVER CAGE ASSEMBLY WITH GROUNDING DEVICE

(75) Inventor: Wan-Cheng Wang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 303 days.

(21) Appl. No.: 11/309,637

(22) Filed: Sep. 1, 2006

(65) Prior Publication Data

US 2007/0197060 A1 Aug. 23, 2007

(30) Foreign Application Priority Data

Feb. 22, 2006 (CN) ........................ 2006 1 0033940

(51) Int. Cl.
*H05K 9/00* (2006.01)

(52) U.S. Cl. ........................ 361/753; 361/799; 361/800; 361/816; 361/818; 174/350; 174/351; 174/362; 174/377

(58) Field of Classification Search ................. 361/753, 361/799, 728–730, 800, 818, 816; 174/350, 174/351, 354, 358, 362, 366, 369, 371, 374, 174/377, 387

See application file for complete search history.

(56) References Cited

U.S. PATENT DOCUMENTS

| | | | | |
|---|---|---|---|---|
| 4,386,814 | A * | 6/1983 | Asick | 439/607 |
| 5,204,496 | A * | 4/1993 | Boulay et al. | 174/355 |
| 5,959,244 | A * | 9/1999 | Mayer | 174/369 |
| 6,115,263 | A * | 9/2000 | Babineau et al. | 361/796 |
| 6,359,768 | B1 * | 3/2002 | Eversley et al. | 361/212 |
| 6,612,868 | B2 | 9/2003 | Hwang | |
| 6,683,796 | B2 * | 1/2004 | Radu et al. | 361/818 |
| 6,822,879 | B2 * | 11/2004 | Rathnam et al. | 361/818 |
| 6,878,872 | B2 | 4/2005 | Lloyd et al. | |
| 7,150,653 | B1 * | 12/2006 | Mason | 439/609 |
| 7,357,673 | B2 * | 4/2008 | Long | 439/608 |
| 7,438,596 | B2 * | 10/2008 | Phillips | 439/607 |
| 7,473,139 | B2 * | 1/2009 | Barringer et al. | 439/609 |
| 2004/0027818 | A1 * | 2/2004 | Rathnam et al. | 361/816 |

* cited by examiner

*Primary Examiner*—Dean A. Reichard
*Assistant Examiner*—Dameon E Levi
(74) *Attorney, Agent, or Firm*—Wei Te Chung

(57) ABSTRACT

A transceiver cage assembly includes a housing (10) and a grounding device (20). The housing includes at least one receiving space for receiving at least one transceiver module. The grounding device mounted on the housing includes a flat main member (200), and at least one resilient member (220) protruding from the main member. The grounding device provides electrical connection between the housing and bezels.

13 Claims, 4 Drawing Sheets

TRANSCEIVER CAGE ASSEMBLY WITH GROUNDING DEVICE

FIELD OF THE INVENTION

The present invention relates to a cage for shielding electromagnetic interference, and specifically to a transceiver cage assembly with a grounding device.

DESCRIPTION OF RELATED ART

Transceiver modules provide bi-directional transmission of data between an electrical interface and an optical data link. The module receives electrical signals and converts them into optical signals that are then transmitted over the optical data link. The module also receives optical signals, converts them into electrical signals, and transmits the electrical signals to the electrical interface.

Normally, the transceiver module connected to a metal cage assembly is mounted on a printed circuit board (PCB) of a host computer, an input/output system, a peripheral device, or a switch. The metal cage assembly functions to dissipate electrostatic buildup, and serves as an electromagnetic shield.

Referring to FIG. 4, a conventional transceiver cage assembly 30 for shielding transceiver modules (not shown) therein, includes several exterior walls 31,32,33 and a front end 300. A plurality of grounding fingers 320 extends from the front end 300, and protrudes outwardly from the exterior walls 31,32,33. In assembly, the transceiver cage assembly 30 is attached to a circuit board (not shown), and the front end 300 of the transceiver cage assembly 30 is inserted into a pair of openings of a bezel 40 of a device (not shown), and thus, the grounding fingers 320 adjacent to the front end 300 of the transceiver cage assembly 30 abut against edges of the bezel 40 and bound the openings.

The transceiver cage assembly 30 dissipates electromagnetic interference through the grounding fingers 320. Because density of the grounding fingers 320 of the transceiver cage assembly 30 is low, especially around the two exterior walls 33, and contacting area between the grounding fingers 320 and the bezel 40 is too small, dissipation of electromagnetic interference is inefficient.

Further, because of the grounding fingers 320 protruding outwardly, interferingly fitting the cage assembly 30 with the bezel 40 is difficult to accomplish.

Therefore, a heretofore unaddressed need exists in the industry to overcome the aforementioned deficiencies and inadequacies.

SUMMARY OF THE INVENTION

In one aspect of the embodiment, a transceiver cage assembly includes a housing and a grounding device. The housing includes at least one receiving space for receiving at least one transceiver module. The grounding device mounted on the housing includes a flat main member, and at least one resilient member protruding from the main member.

In another aspect of the embodiment, a grounding device is mounted on a shielding housing which accommodates at least one transceiver module. The grounding device includes a flat main member, at least one resilient member, and at least one latching member. The resilient member and the latching member extend from two opposite sides of the main member respectively.

Other advantages and novel features will become more apparent from the following detailed description when taken in conjunction with the accompanying drawings, in which;

DETAILED DESCRIPTION OF THE INVENTION

Figure 1:
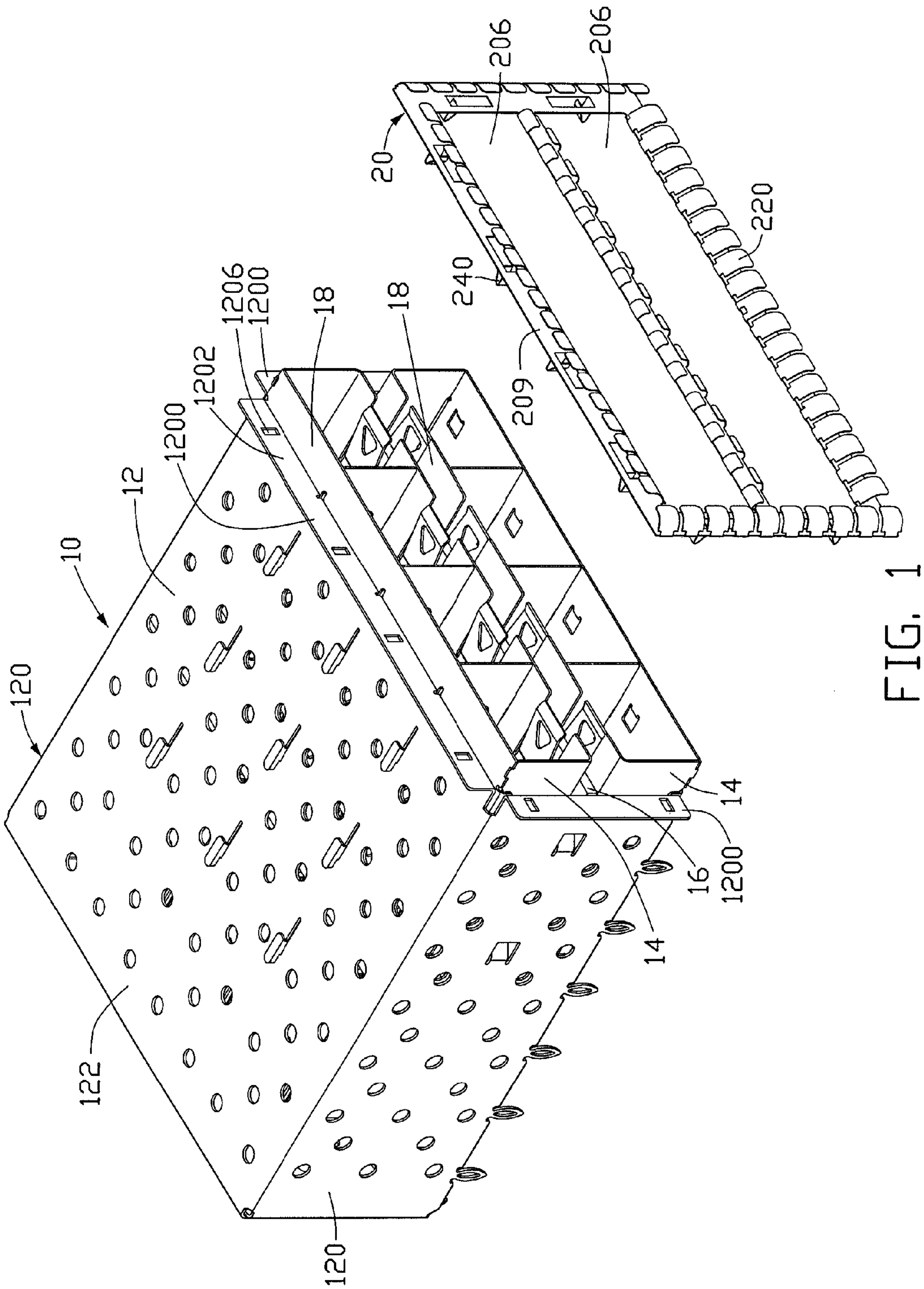
FIG. 1 is an exploded, perspective view of a transceiver cage assembly in accordance with an exemplary embodiment of the present invention.
Figure 2:
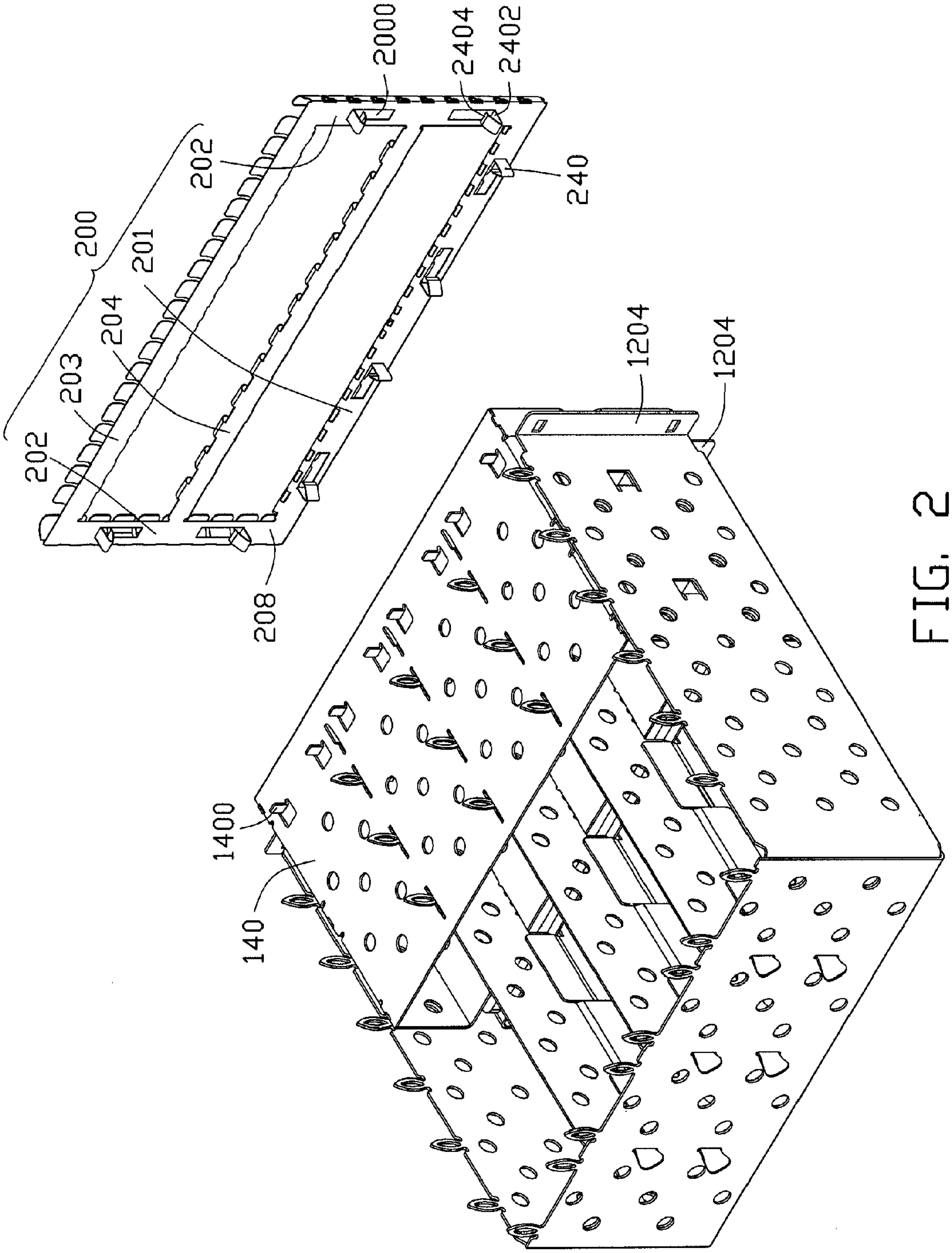
FIG. 2 is an inverted view of FIG. 1.

Referring to FIGS. 1-2, a transceiver cage assembly of an exemplary embodiment of the present invention includes a housing 10 and a grounding device 20.

The housing 10, which is for accommodating transceiver modules, includes a cover 12, a pair of body cages 14 aligned vertically, and a spacer 16. The spacer 16 is disposed between the body cages 14. The spacer 16 and the body cages 14 are assembled together and are electrically connected to each other. The cover 12 includes a cavity for receiving the body cages 14 and the spacer 16. The body cages 14 each define a plurality of receiving spaces for receiving the transceiver modules. A front end 18 spans a top of each body cage 14 and is used for inserting into the grounding device 20. A plurality of stopper portions 1400 for resisting and securing the grounding device 20, extend out from an exterior bottom wall 140 of one of the body cages 14.

The cover 12 of the housing 10 includes a top wall 122, a pair of sidewalls 120, and a rear wall (not labeled). The sidewalls 120 and the top wall 122 respectively include a flange 1200. The flanges 1200 are respectively formed integrally with the sidewalls 120 and the top wall 122, and respectively extend perpendicularly from ends of the sidewalls 120 and the top wall 122. The flanges 1200 include a first surface 1202 adjacent to the front end 18, a second surface 1204 opposite to the first surface 1202, and a plurality of rectangular holes 1206 are defined in the flanges 1200.

The grounding device 20 for shielding electromagnetic interference is mounted to the front end 18 of the housing 10. The grounding device 20 includes a flat main member 200, a plurality of resilient members 220, and a plurality of V-shaped latching members 240. The main member 200 has a shape of a rectangular frame, and includes a first end portion 201, a pair of second end portions 202, a third end portion 203, and a connecting portion 204.

The first end portion 201 is opposite to the third end portion 203, the second end portions 202 are opposite to each other, and the second end portions 202 interconnect the first end portion 201 and the third end portion 203. The connecting portion 204 is disposed between the first end portion 201 and the third end portion 203, and parallel with the first end portion 201 and the third end portion 203. Two ends of the connecting portion 204 are respectively perpendicularly connected to middles of the second end portions 202. The first end portion 201, the second end portions 202, the third end portion 203, and the connecting portion 204 are substantially coplanar, and cooperatively bound two openings 206 suitable to receive the front end 18 of the housing 10 and sides and bottoms of the body cages 14.

The main member 200 further includes a first side 208 and a second side 209 opposite to the first side 208. When the grounding device 20 is attached to the housing 10, the first side 208 abuts against the flanges 1200 of the housing 10.

A plurality of rectangular grooves 2000 are defined in the first end portion 201 and the second end portions 202 of the main member 200. The latching members 240 and the grooves 2000 are both formed by stamping the main member 200 through from the second side 209 to the first side 208. The latching members 240 are configured for inserting into the holes 1206 of the housing 10. Each latching member 240 includes a connecting end 2402 connected to the main member 200, and a free end 2404 located in another end of the latching member 240. In the embodiment, the latching members 240 extend outwardly from the first side 208 of the main member 200.

The resilient members 220 of the grounding device 20 extend outwardly from the second side 209 of the main member 200, and are disposed on the first end portion 201, the second end portions 202, the third end portion 203, and the connecting portion 204.

In the embodiment, the resilient members 220 disposed on the first end portion 201 protrude from an edge of the first end portion 201 adjacent to the opening 206, and are bent back relative to the opening 206. The resilient members 220 disposed on the second end portions 202 respectively protrude from an edge of the second end portion 202 away from the opening 206, and are bent towards the opening 206. The resilient members 220 disposed on the third end portion 203 protrude from an edge of the third end portion 203 adjacent to the opening 206, and are bent back relative to the opening 206. Two interlaced rows of the resilient members 220 are disposed in the connecting portion 204, and respectively protrude from two opposite edges of the connecting portion 204, and are bent towards each other. In another embodiment, the resilient members 220 protrude from a discretional edge of the main member 200, and are bent towards another edge of the main member 200.

Figure 3:
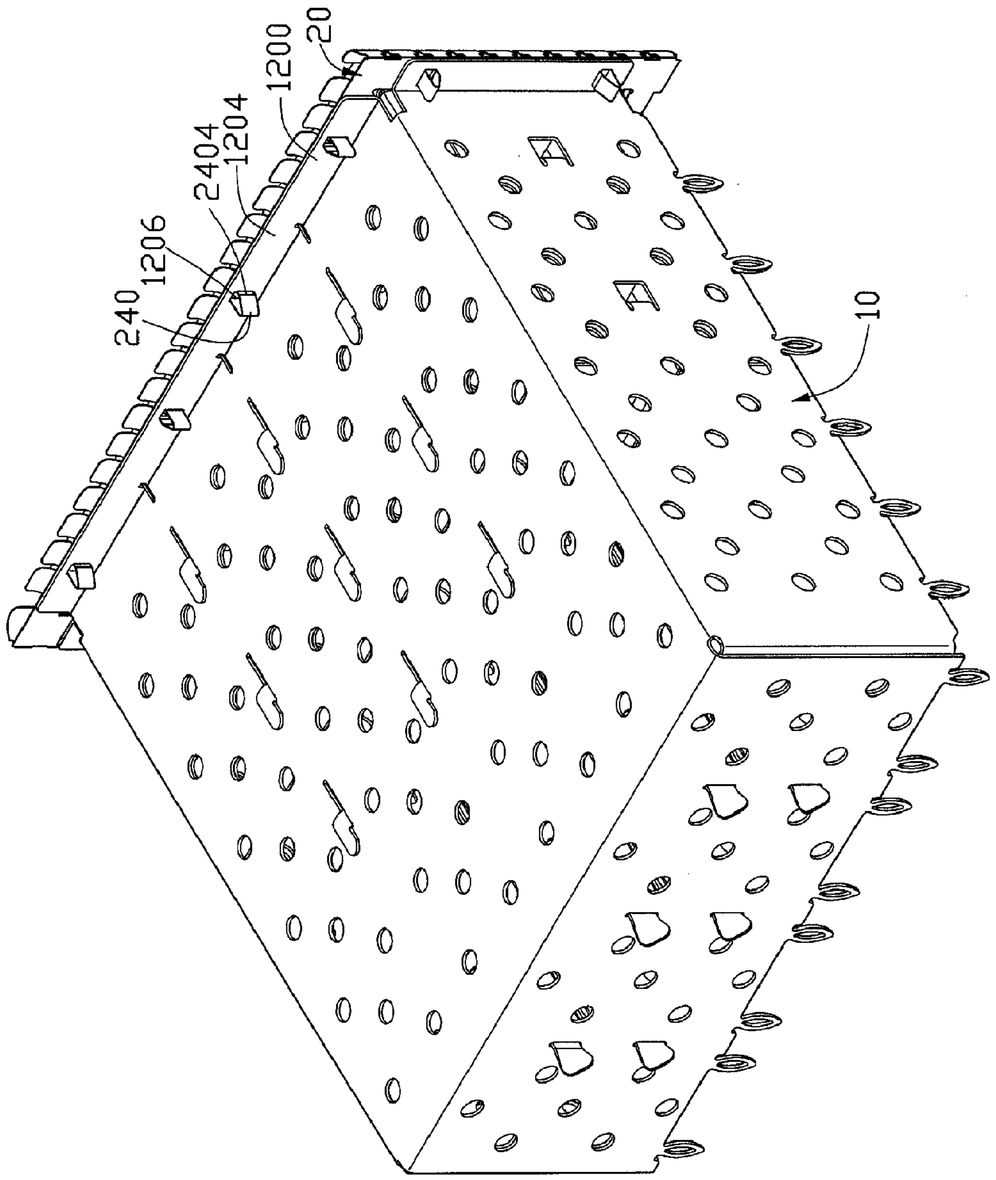
FIG. 3 is an assembled view of FIG. 1, but viewed from another aspect.

Referring to FIG. 3, the grounding device 20 and the housing 10 are assembled together by inserting the latching members 240 of the grounding device 20 into the holes 1206 of the housing 10. In assembly, the latching members 240 resiliently deform, and the grounding device 20 is mounted on the housing 10 after the latching members 240 return to their original states. The grounding device 20 is unlikely to fall off from the housing 10, since the free end 2404 of each latching member 240 hooks the second surface 1204 of the flanges 1200 of the housing 10, and the stopper portions 1400 resist and secure the third end portion 203 of the grounding device 20. In this position, the flanges 1200 of the housing 10 are electrically connected to the first end portion 201 and the second end portions 202 of the grounding device 20, and the spacer 16 of the housing 10 is electrically connected to the connecting portion 204 of the grounding device 20.

Figure 4:
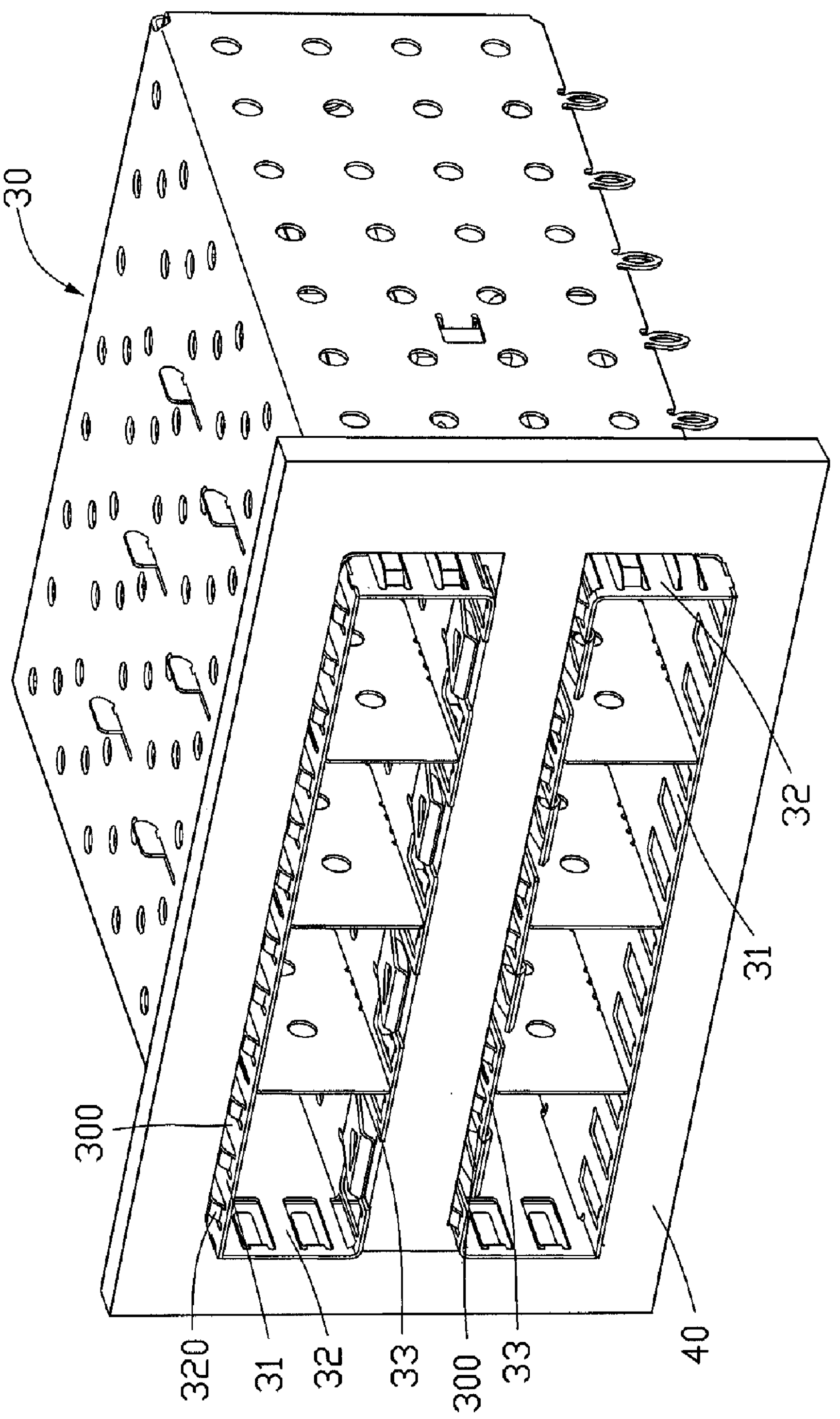
FIG. 4 (RELATED ART)
FIG. 4 is a perspective view of a conventional transceiver cage assembly.

The transceiver cage assembly is mounted to a bezel (the same as the bezel 40 of FIG. 4) of a device (not shown), which has a pair of openings formed therein through which electronic modules can be passed into the receiving spaces. The bezel 40 is typically conductive and it may also provide additional EMI suppression, but can also provide a substrate to which labeling can be applied. The bezel 40 is sized and shaped such that the opening encases or encircles the front end 18 of the transceiver cage assembly. Dimensions of the openings of the bezel 40 do not normally allow for a tight mechanical bond and a tight electrical connection between the bezel 40 and exterior walls of the front end 18 of the transceiver cage assembly.

While exemplary embodiments have been described above, it should be understood that they have been presented by way of example only and not by way of limitation. Thus the breadth and scope of the present invention should not be limited by the above-described exemplary embodiments, but should be defined only in accordance with the following claims and their equivalents.

What is claimed is:

1. A transceiver cage assembly mounted in a device, comprising:

a housing comprising at least one receiving space for receiving at least one transceiver module; and a grounding device mounted on the housing between the housing and a panel of the device to shield said transceiver module from electromagnetic interference, comprising a flat main member, and a plurality of resilient members protruding from the main member toward the panel of the device and away from the housing;

wherein the housing comprises at least one flange extending away from the housing, and portions of the main member engage against said at least one flange of the housing to be retainable with the housing, and wherein the main member further comprises at least one latching member extending toward the housing at a first side of the main member to be the portions of the main member, and said flange defines at least one hole therein engagable with said latching member to fix the main member on the housing.

2. The transceiver cage assembly of claim 1, wherein the main member has a rectangular frame shape.

3. The transceiver cage assembly of claim 1, wherein the housing comprises a front end, the grounding device is mounted on the front end of the housing.

4. The transceiver cage assembly of claim 1, wherein the main member comprises at least one opening, a first end portion, a pair of second end portions, and a third end portion opposite to the first end portion, the pair of second end portions interconnecting the first end portion and the third end portion, the first, second, and third end portions cooperatively bounding said at least one opening.

5. The transceiver cage assembly of claim 1, wherein the main member further comprises at least one groove correspondingly adjacent to said at least one latching member, and said at least one groove and said at least one latching member are formed by stamping the main member through from the first side of the main member to a second side opposite to the first side.

6. An assembly comprising:

a cage housing defining a plurality of spatially separate receiving spaces therein, each of said plurality of spaces spatially extending parallel to each other from a side of said housing, and at least one flange extending away from said housing along said side of said housing;

a transceiver module removably receivable in said each of said plurality of spaces of said housing for further electrical connection;

a bezel extending beside said housing along said side of said housing, said each of said plurality of spaces in said housing reachably extendable toward said bezel so as to be spatially exposable through said bezel; and a grounding device installable between said bezel and said side of said housing, said grounding device comprising a flat main member extending along said side of said housing and defining at least one opening therein for extension of said each of said plurality of spaces toward said bezel, portions of said main member engagable against said at least one flange of said housing in order to be retainable with said housing, and at least one resilient member protruding from said main member toward said bezel to be electrically engagable with said bezel.

7. The assembly of claim 6, wherein said at least one opening of said main member is used for said extension of more than two of said plurality of spaces toward said bezel.

8. The assembly of claim 6, wherein said main member comprises at least one latching member extending from a first side thereof to be said portions of said main member, and said flange defines at least one hole therein to be correspondingly engagable with said at least one latching member.

9. The assembly of claim 8, wherein said main member further comprises at least one groove correspondingly adjacent to said at least one latching member, and said at least one groove and said at least one latching member are formed by stamping said main member through from said first side of said main member to a second side opposite to said first side.

10. The transceiver cage assembly of claim 4, wherein a plurality of latching members are respectively disposed on the first and second end portions to engage with the housing.

11. The transceiver cage assembly of claim 10, wherein every two of the plurality of latching members disposed on the first and second end portions are bent toward each other.

12. The transceiver cage assembly of claim 4, wherein the plurality of resilient members are respectively disposed on the first, second, and third end portions.

13. The transceiver cage assembly of claim 12, wherein the plurality of resilient members disposed on the first and third end portions are bent away from the at least one opening, and the plurality of resilient members disposed on the second end portions are bent toward the at least one opening.

* * * * *